United States Patent
Sun et al.

(10) Patent No.: US 12,019,042 B2
(45) Date of Patent: Jun. 25, 2024

(54) LIGHTNING DAMAGE ASSESSMENT METHOD FOR CARBON FIBER REINFORCED POLYMER MATERIAL CONSIDERING NON-LINEAR IMPEDANCE CHARACTERISTIC

(71) Applicant: XI'AN JIAOTONG UNIVERSITY, Shaanxi (CN)

(72) Inventors: Jinru Sun, Shaanxi (CN); Xueling Yao, Shaanxi (CN); Jingliang Chen, Shaanxi (CN); Wenju Xu, Shaanxi (CN)

(73) Assignee: XI'AN JIAOTONG UNIVERSITY, Shaanxi (CN)

( * ) Notice: Subject to any disclaimer, the term of this patent is extended or adjusted under 35 U.S.C. 154(b) by 749 days.

(21) Appl. No.: 17/055,577

(22) PCT Filed: Oct. 11, 2019

(86) PCT No.: PCT/CN2019/110579
§ 371 (c)(1),
(2) Date: Nov. 14, 2020

(87) PCT Pub. No.: WO2020/114080
PCT Pub. Date: Jun. 11, 2020

(65) Prior Publication Data
US 2021/0215629 A1     Jul. 15, 2021

(30) Foreign Application Priority Data
Dec. 6, 2018    (CN) .......................... 201811488125.8

(51) Int. Cl.
*B64D 45/02*     (2006.01)
*G01N 27/02*     (2006.01)
*G01R 27/16*     (2006.01)

(52) U.S. Cl.
CPC ........... *G01N 27/028* (2013.01); *G01R 27/16* (2013.01); *B64D 45/02* (2013.01)

(58) Field of Classification Search
CPC ...... G01N 27/02; G01N 27/028; G01R 27/16; G01R 29/0842; G01R 29/0807;
(Continued)

(56) References Cited

U.S. PATENT DOCUMENTS 8,517,300 B2 * 8/2013 Simmons ................ B32B 27/42
                                                                                      244/133
10,317,353 B2 * 6/2019 Khosravani ............ G01R 27/08
(Continued)

FOREIGN PATENT DOCUMENTS

AU      2009200830 B2 * 8/2013 ............. B64D 45/02
CA         3031038 A1 * 1/2018 ............. B64D 45/02
(Continued)

OTHER PUBLICATIONS

Wang et al., Understanding lightning strike induced damage mechanism of carbon fiber reinforced polymer composites: An experimental study. Materials and Design 192 (2020). @ 2020 Published by Elsevier Ltd. (Year: 2020).*
(Continued)

*Primary Examiner* — Paresh Patel

(57) ABSTRACT

A lightning damage assessment method for the carbon fiber reinforced polymer (CFRP) material considering non-linear impedance characteristic includes steps of: studying various influencing factors of the lightning damage of the CFRP material under the action of the single lightning current component; obtaining the law between the lightning damage of the CFRP material, including the lightning damage area and depth, and various influencing factors, including the peak value, the rising rate, the charge transfer amount, the specific energy of the single lightning current component,
(Continued)

and the non-linear impedance characteristic of the CFRP; on the basis of the law, building the multi-factor assessment model of the lightning damage of CFRP material under the action of the single lightning current component; and obtaining mathematical expressions between the lightning damage of the CFRP material and the influencing factors.

2 Claims, 3 Drawing Sheets

(58) Field of Classification Search
CPC .... G01R 31/2812; B64D 45/02; H02H 1/003; H01H 3/20–22; G06F 2113/26
See application file for complete search history.

(56) References Cited

U.S. PATENT DOCUMENTS

| | | | | |
|---|---|---|---|---|
| 2011/0017867 | A1* | 1/2011 | Simmons | B32B 27/34 428/300.1 |
| 2014/0047710 | A1* | 2/2014 | Simmons | B32B 27/18 977/778 |
| 2016/0347918 | A1* | 12/2016 | Le | B29C 70/302 |
| 2018/0266974 | A1* | 9/2018 | Khosravani | G01R 27/08 |
| 2021/0199613 | A1* | 7/2021 | Sun | G01N 27/20 |
| 2021/0215629 | A1* | 7/2021 | Sun | G01N 27/028 |

FOREIGN PATENT DOCUMENTS

| | | | | |
|---|---|---|---|---|
| CN | 103018645 A | * | 4/2013 | |
| CN | 103048381 A | * | 4/2013 | |
| CN | 203037807 U | * | 7/2013 | |
| CN | 203037808 U | * | 7/2013 | |
| CN | 103048381 B | * | 6/2015 | |
| CN | 104748991 A | * | 7/2015 | B29C 73/10 |
| CN | 105021688 A | * | 11/2015 | |
| CN | 105021927 A | * | 11/2015 | |
| CN | 105158572 A | * | 12/2015 | |
| CN | 105300583 A | * | 2/2016 | |
| CN | 105158572 B | * | 2/2018 | |
| CN | 109492330 A | * | 3/2019 | G06F 30/20 |
| CN | 109598069 A | * | 4/2019 | G01N 27/028 |
| CN | 109738489 A | * | 5/2019 | |
| CN | 109765268 A | * | 5/2019 | |
| CN | 109781786 A | * | 5/2019 | |
| CN | 109783847 A | * | 5/2019 | |
| CN | g | * | 5/2019 | G01N 27/20 |
| CN | 109891092 A | * | 6/2019 | F03D 17/00 |
| CN | 111609957 A | * | 9/2020 | G01L 1/16 |
| CN | 111716835 A | * | 9/2020 | |
| CN | 109765268 B | * | 12/2020 | |
| CN | 109783847 B | * | 12/2020 | |
| CN | 111609958 B | * | 4/2021 | G01L 1/16 |
| CN | 109783848 B | * | 4/2022 | |
| CN | 217212840 U | * | 8/2022 | |
| CN | 115358038 A | * | 11/2022 | |
| CN | 109598069 B | * | 12/2022 | G01N 27/028 |
| EP | 3272656 A1 | * | 1/2018 | B64D 45/02 |
| EP | 3379270 A1 | * | 9/2018 | B64F 5/60 |
| WO | WO-2018015592 A1 | * | 1/2018 | B64D 45/02 |
| WO | WO-2020114079 A1 | * | 6/2020 | G01N 27/20 |
| WO | WO-2020114080 A1 | * | 6/2020 | G01N 27/028 |
| WO | WO-2020114082 A1 | * | 6/2020 | |

OTHER PUBLICATIONS

Sun et al., Evaluation method for lightning damage of carbon fiber reinforced polymers subjected to multiple lightning strikes with different combinations of current. Journal of Composite Materials 2020, vol. 54(1) 111-125. @The Author(s) 2019 (Year: 2019).*
Chen et al., Damage Investigation of Carbon-Fiber-Reinforced Plastic Laminates with Fasteners Subjected to Lightning Current Components C and D. www.mdpi.com/journal/applsci Appl. Sci. 2020, 10, 2147 (Year: 2020).*
Gao et al., Electromagnetic Behavior Analysis of Aircraft Composite under Lightning Direct Effect. Proc. of the 2017 International Symposium on Electromagnetic Compatibility—EMC Europe 2017, Angers, France, Sep. 4-8, 2017. IEEE (Year: 2017).*
Zhu et al., Finite Element Analysis of Lightning Damage Factors Based on Carbon Fiber Reinforced Polymer. https://www.mdpi.com/journal/materials Materials 2021, 14, 5210. (Year: 2021).*
English Translation of Written Opinion of the International Searching Authority—PCT/CN2019/110579. (Year: 2020).*
Tian et al., Study on the Factors Influencing the Damage Modes of Carbon Fiber-Reinforced Polymer Composites with a Fastener Under Lightning Strike Conditions. Applied Composite Materials (2022) 29:711-727 (Year: 2022).*
Lin et al., Evaluating the Lightning Strike Damage Tolerance for CFRP Composite Laminates Containing Conductive Nanofillers. Applied Composite Materials. @The Author(s), under exclusive licence to Springer Nature B.V. 2022 (Year: 2022).*

* cited by examiner

LIGHTNING DAMAGE ASSESSMENT METHOD FOR CARBON FIBER REINFORCED POLYMER MATERIAL CONSIDERING NON-LINEAR IMPEDANCE CHARACTERISTIC

CROSS REFERENCE OF RELATED APPLICATION

This is a U.S. National Stage under 35 U.S.C 371 of the International Application PCT/CN2019/110579, filed Oct. 11, 2019, which claims priority under 35 U.S.C. 119(a-d) to CN 201811488125.8, filed Dec. 6, 2018.

BACKGROUND OF THE PRESENT INVENTION

Field of Invention

The present invention belongs to an assessment method of lightning damage of a carbon fiber reinforced polymer material, and more particularly to a lightning damage assessment method for a carbon fiber reinforced polymer material considering non-linear impedance characteristic.

Description of Related Arts

Carbon fiber reinforced polymer (CFRP) composites not only have the characteristics of low density, high strength, high modulus, high temperature resistance and chemical corrosion resistance, but also have the good processability of textile fibers, and are widely used in various fields such as aerospace, military and civil industries. With the improvement of aircraft design and the advancement of CFRP material technology, CFRP composites are increasingly used in large civilian aircrafts, military aircrafts, unmanned aerial vehicles (UAVs) and stealth aircrafts. In 1960, the amount of CFRPs on McDonnell Douglas DC-9 was less than 1%; by the end of 2011, the main wing, tail wing, fuselage and floor of Boeing 787 Dreamliner are basically made from CFRP composites which represent 50% of aircraft weight, and the proportion of CFRPs on the Airbus A350XWA reached 53 wt %.

Compared with the aluminum, steel and titanium alloy materials traditionally used in aircrafts, CFRP has poor electrical conductivity. Generally speaking, the resistivity of the CFRP laminate in the longitudinal fiber direction is on the order of $10^{-5}$ $\Omega \cdot m$, the resistivity thereof in the transverse fiber direction is on the order of $10^{-1}$ $\Omega \cdot m$, and the in-thickness resistivity is greater, which prevents the CFRP laminate from having the ability to quickly transfer or diffuse heat and accumulated charges in a short time like metal materials under lightning strikes, so that the accumulated energy causes the temperature of CFRP to rise sharply, resulting in severe damages such as fiber breakage, resin pyrolysis, and delamination of CFRP.

The EU and US standard stipulate the direct lightning test requirements and the lightning current components of aircrafts, wherein the lightning current components include component A (first lightning return component) or Ah (transition component of the first lightning return), component B (intermediate current component), component C/C* (continuous current component) and component D (subsequent return component) current waves, here, the lightning current components A, Ah and D have high peaks (which are respectively 200 kA, 150 kA and 100 kA) and fast-rising rates; the lightning current component B is a double exponential wave with an average current of 2 kA, a short rise time, and a duration of several milliseconds, or a square wave current with a slow rise; the lightning current component C is a current wave with a slow rise and a duration of hundreds of milliseconds.

Since the advent of CFRP, mechanical properties of CFRP have been the research hotspots, and many researchers obtained the influence of the mechanical impact parameters on the residual tensile strength, residual compressive strength, damage area and damage depth of CFRP. At present, the research on lightning damage of CFRP materials has gained more and more attention. Since experimental investigation are limited by the realization of the extremely high-intensity and transient duration of lightning current, many researchers have established coupled thermoelectric simulation models of lightning damage of CFRP composites under the action of a single lightning current component, and then preliminarily obtained the influence laws of lightning damage area and lightning damage depth of CFRP composites through simulation and calculation.

However, the quantitative relationship between the lightning damage of the CFRP composites and the multiple influencing factors, including the peak value, the rising rate, the charge transfer amount, the specific energy of the lightning current component and the dynamic impedance characteristic of the CFRP materials, has not been obtained. The evaluation method of lightning damage of the CFRP materials lags far behind, which greatly hinders the research on material formulation and processing technologies and the performance improvement of CFRP materials, thus restricting applications of the CFRP materials in the aerospace field.

SUMMARY OF THE PRESENT INVENTION

An object of the present invention is to provide a lightning damage assessment method for a carbon fiber reinforced polymer (CFRP) material considering non-linear impedance characteristic. The method is able to obtain the law between the lightning damage of the CFRP material, including the lightning damage area and the lightning damage depth, and various influencing factors, so as to provide the theoretical basis for the future research in material formulation and processing technologies and the performance improvement of the CFRP material.

To achieve the above object, the present invention adopts a technical solution as follows.

A lightning damage assessment method for a CFRP material considering non-linear impedance characteristic comprises steps of:

taking a peak value, an rising rate, a charge transfer amount, a specific energy of a single lightning current component and a discharge gap as influencing factors of lightning damage of the CFRP material under an action of the single lightning current component; under a premise of considering a non-linear characteristic of the CFRP material, introducing a non-linear impedance of the CFRP material into a multi-factor assessment model of the lightning damage; under an action of a specified lightning current component, adjusting the specific energy of the specified lightning current component through the non-linear impedance of the CFRP material; obtaining experimental data of various influencing factors of the specified single lightning current component, and experimental data of a lightning damage area and a lightning damage depth of the CFRP material; building a multi-factor assessment model of the lightning damage area and the lightning damage depth of the CFRP material; and calculating coefficients corresponding to the multiple influencing factors of the lightning damage area and the lightning damage depth of the CFRP material, thus providing a theoretical basis for researches on formulation and processing technologies of the CFRP material.

Preferably, the method specifically comprises steps of:

(1) determining at least 3 discharge gaps for lightning damage test of the CFRP material in a range of 1-10 mm;

(2) determining a current range of lightning current component and setting current test points no less than 5;

(3) selecting a first discharge gap for the lightning damage test of the CFRP material to be tested, outputting an initial test current $I_{des11}$ by a single lightning current component generating circuit, performing the lightning damage test on the tested CFRP material, measuring and storing the lightning current $I_{des11}$ which flows through the tested CFRP material and a voltage $U_{des11}$ of the tested CFRP material, and obtaining a lightning damage area $S_{des11}$ and a lightning damage depth $D_{des11}$ through ultrasonic C/B scanning imaging;

(4) outputting a second test current $I_{des12}$ by the single lightning current component generating circuit, performing the lightning damage test on the tested CFRP material, measuring and storing the test current $I_{des12}$ which flows through the tested CFRP material and a voltage $U_{des12}$ of the tested CFRP material, and obtaining a lightning damage area $S_{des12}$ and a lightning damage depth $D_{des12}$ through ultrasonic C/B scanning imaging;

(5) judging whether the test current $I_{des12}$ which flows through the tested CFRP material reaches a termination current value; if the lightning current $I_{des12}$ which flows through the tested CFRP material does not reach the termination current value, the single lightning current component generating circuit outputting a next test current till the test current reaches the termination current value, measuring and storing a lightning current $I_{des1n}$ which flows through the tested CFRP material and a voltage $U_{des1n}$ of the tested CFRP material, and obtaining a lightning damage area $S_{des1n}$ and a lightning damage depth $D_{des1n}$ through ultrasonic C/B scanning imaging;

(6) selecting a next discharge gap for the lightning damage test of the tested CFRP material;

(7) repeating the steps (3) to (5), obtaining ($S_{des21}$, $D_{des21}$), ($S_{des22}$, $D_{des22}$), . . . , ($S_{des2n}$, $D_{des2n}$) till obtaining ($S_{desm1}$, $D_{desm1}$), ($S_{desm2}$, $D_{desm2}$), . . . , ($S_{desmn}$, $D_{desmn}$), wherein m is an amount of the selected discharge gaps which is not less than 3; and (8) analyzing and processing the obtained multiple lightning damage areas and the obtained lightning damage depths ($S_{des11}$, $D_{des11}$), ($S_{des12}$, $D_{des12}$), . . . , ($S_{des1n}$, $D_{des1n}$), ($S_{desm1}$, $D_{desm1}$), ($S_{desm2}$, $D_{desm2}$), . . . , ($S_{desmn}$, $D_{desmn}$) of the tested CFRP material, obtaining an effect of multiple influencing factors which are respectively an amplitude, a rising rate, a charge transfer amount and a specific energy of the single lightning current component on the lightning damage area and damage depth of the CFRP material, building a lightning damage assessment model of the CFRP material, and solving coefficients corresponding to the multiple influencing factors of lightning damage of the tested CFRP material.

Preferably, under a premise of considering the non-linear impedance characteristic of the CFRP material under an action of the single lightning current component, the non-linear impedance of the CFRP material is introduced into the lightning damage assessment model; the specific energy is adjusted through the non-linear impedance of the CFRP material under the action of the specified single lightning current component; relationships between the lightning damage area and depth and the parameters of the specified single lightning current component are expressed by formulas of:

$$S_{des} = k_{1s} \times \frac{di}{dt} + k_{2s} \int i dt + k_{3s} \times Z_R \times \int i^2 dt; \quad (1)$$

$$D_{des} = k_{1d} \times \frac{di}{dt} + k_{2d} \times \int i dt + k_{3d} \times Z_R \times \int i^2 dt, \quad (2)$$

wherein $k_{1s}$, $k_{2s}$ and $k_{3s}$ are respectively coefficients of the rising rate, the charge transfer amount and the specific energy of the specified single lightning current component to the lightning damage area of the CFRP material; $k_{1d}$, $k_{2d}$ and $k_{3d}$ are respectively coefficients of the rising rate, the charge transfer amount and the specific energy of the specified single lightning current component to the lightning damage depth of the CFRP material; $Z_R$ is an equivalent dynamic impedance of CFRP material corresponding to the peak value of the single specified lightning current component.

The lightning damage assessment method for the CFRP material considering non-linear impedance characteristic provided by the present invention comprises steps of: studying various influencing factors of the lightning damage of the CFRP material under the action of the single lightning current component; obtaining the law, between the lightning damage of the CFRP material and various influencing factors including the peak value, the rising rate, the charge transfer amount, the specific energy of the single lightning current component, and the non-linear impedance characteristic of the CFRP fiber; on the basis of the law, introducing the non-linear impedance of the CFRP material into the lightning damage assessment model; adjusting the specific energy by the non-linear impedance of the CFRP material under the action of the specific single lightning current component; building the multi-factor assessment model of the lightning damage of CFRP material under the action of the single lightning current component; and obtaining mathematical expressions between the lightning damage of the CFRP material, including the lightning damage area and the lightning damage depth, and the influencing factors. The method studies the lightning damage mechanism of the CFRP material and provides the theoretical basis for researches on formulation and processing technologies of the CFRP material.

Figure 1:
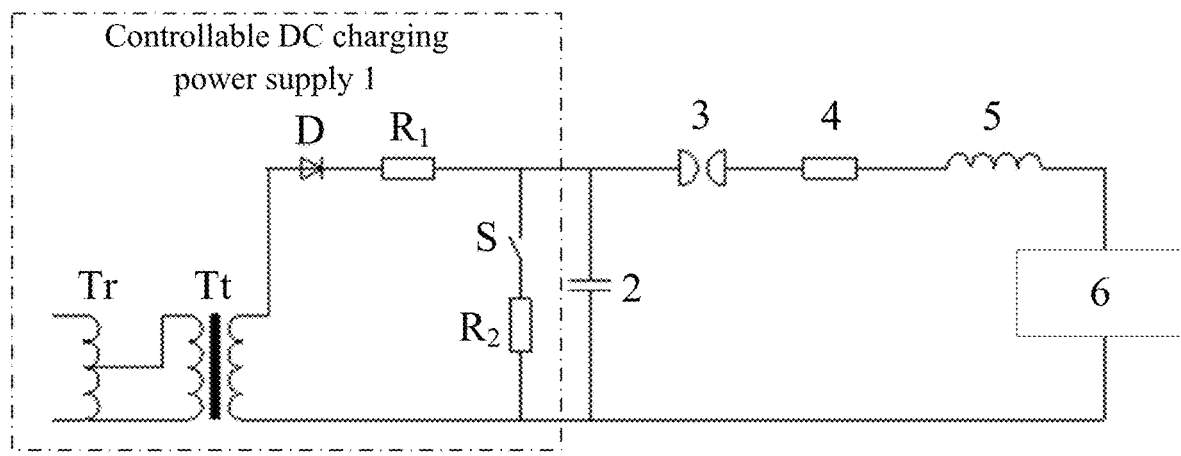
FIG. 1 is a schematic diagram of a lightning current component test circuit provided by the present invention.

In the drawings, 1: controllable direct current (DC) charging power supply; 2: energy storage capacitor unit; 3: discharge switch; 4: waveform adjustment resistor; 5: waveform adjustment inductor; 6: tested CFRP material; 11: electrode bar; 12: tip of electrode bar; 13: insulated cover; 141: first electrode block; 142: second electrode block; 15: spring; 161: first bolt; 162: second bolt; 171: first nut; 172: second nut; 181: first gasket; 182: second gasket; 191: first insulated support; 192: second insulated support; 110: insulated base of fixture for installing tested CFRP material; 111: third bolt; 112: fourth bolt; 113: fixed insulated sleeve; 114: third nut.

DETAILED DESCRIPTION OF THE PREFERRED EMBODIMENT

The principle and calculation method of the present invention are further described in detail with reference to accompanying drawings and specific embodiments as follows.

Referring to FIG. 1, a lightning current component test circuit provided by the present invention is illustrated, which comprises a controllable DC (direct current) charging power supply 1, wherein the controllable DC charging power supply 1 comprises a voltage regulator Tr, a transformer Tt, a rectifier diode D and a charging resistor $R_1$; a switch S and a resistor $R_2$ form a safety discharge circuit of energy storage capacitor; an energy storage capacitor unit 2 with a capacitance of C, a discharge switch 3, a waveform adjustment resistor 4 with a resistance of R, a waveform adjustment inductor 5 with an inductance of L and the tested CFRP material 6 form a lightning current component test circuit.

Take the lightning current component A as an example to illustrate an adjustment method of parameters of the test circuit of the non-linear lightning current component A. For other lightning current component test circuits, the parameters are able to be selected through referring to this adjustment method.

The lightning current component A satisfies an expression of:

$$i(t) = I_0(e^{-\alpha t} - e^{-\beta t}), \text{ wherein } \alpha = 11354 \text{ s}^{-1} \text{ and } \beta = 647265 \text{ s}^{-1}.$$

Accordingly, a rise time $T_1$ and a half peak time $T_2$ of the lightning current component A are respectively $T_1 = 3.56$ μs and $T_2 = 69$ μs.

Figure 2:
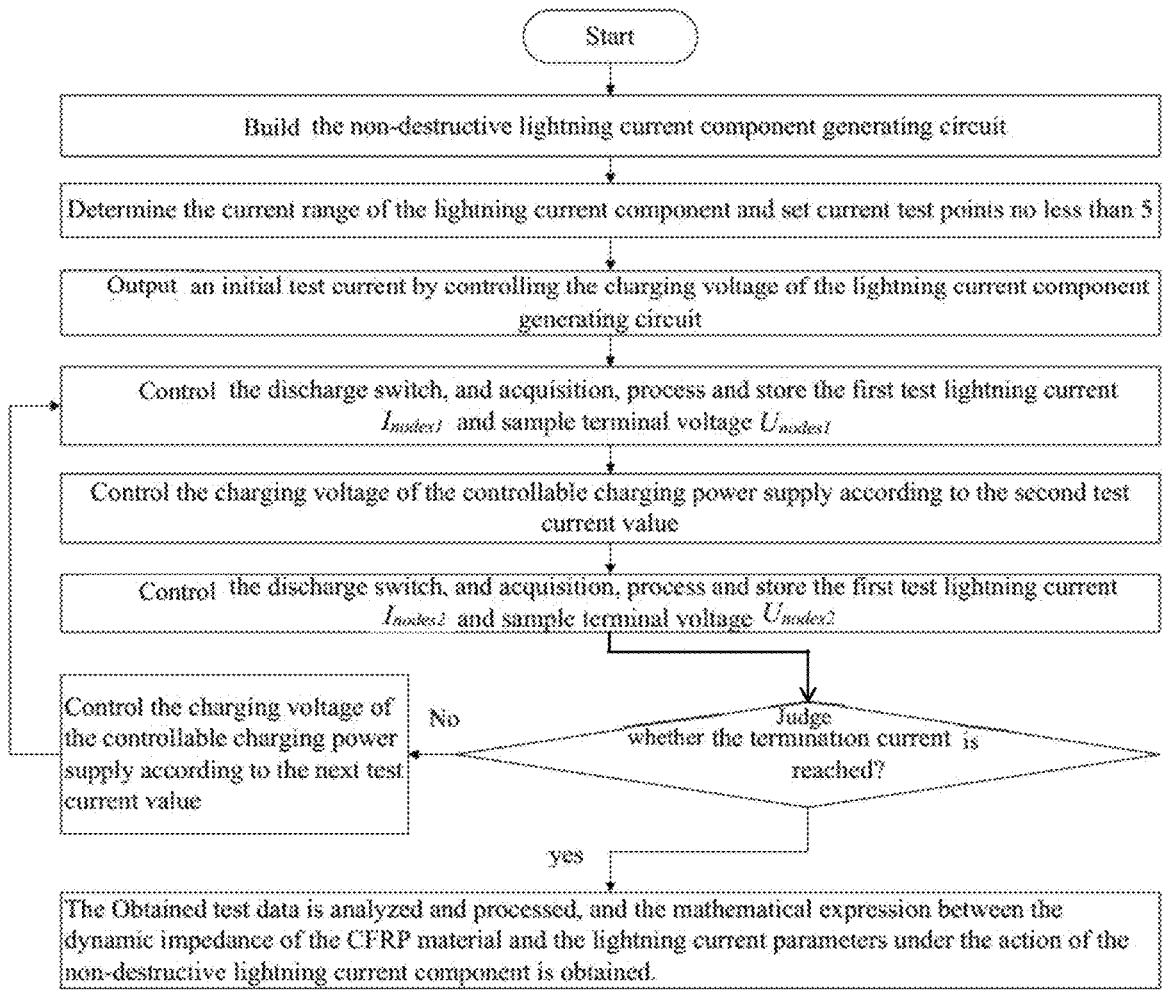
FIG. 2 is a test flow chart of a dynamic impedance characteristic of a CFRP material under an action of a single non-destructive lightning current component provided by the present invention.

A non-linear lightning current component A is generated by an RLC (resistor-inductor-capacitor) circuit, the corresponding circuit parameters are selected as follows.

$$\begin{aligned} i_m^* &= i_m / \frac{U_0}{\sqrt{LC}} \\ T_1^* &= T_1 / \sqrt{LC} \\ \xi &= R/2\sqrt{L/C} \end{aligned} \quad (\text{I})$$

wherein in the formula (I), C is a capacitance of the energy storage capacitor unit 2, R is a resistance of the waveform adjustment resistor 4, L is an inductance of the waveform adjustment inductor 5, $U_0$ is a charging voltage of the energy storage capacitor unit 2, $T_1$ is a front time of the lightning current component, $i_m$ is a peak value of an output current of the RLC circuit, $\xi$ is a damping coefficient of the RLC circuit shown in FIG. 2, $T_1^*$ is a normalization coefficient of the front time, $i_m^*$ is a normalized peak coefficient.

Three equations of the formula (I) contain four unknown numbers, so the formula (I) has infinitely many solutions. If the capacitance of the energy storage capacitor unit is assumed, related parameters are able to be selected according to Table 1 as follows.

TABLE 1

Selection of the parameters of the lightning current component A generating circuit

| Serial No. | Capacitance (C)/ μF | Resistance (R)/ Ω | Inductance (L)/μH |
|---|---|---|---|
| 1 | 100 | 0.9 | 1.4 |
| 2 | 50 | 1.8 | 2.8 |
| 3 | 25 | 3.6 | 4.2 |
| ... | ... | ... | ... |

According to the measurement method disclosed by Chinese Patent ZL 2015104538855, a quasi-dynamic volt-ampere characteristic curve of the CFRP material under the action of the lightning current component A is obtained, as shown in FIG. 2. The obtained volt-ampere characteristic curve of the CFRP material under the action of non-destructive lightning strikes is fitted numerically, so as to obtain a mathematical expression between a dynamic impedance of the CFRP material under the action of the lightning current component and waveform parameters of the applied lightning current component.

A test process of the dynamic impedance characteristic of the CFRP material comprises steps of:
(1) according to the circuit parameters shown in Table 1, building the non-destructive lightning current component generating circuit whose current amplitude is able to be tens of amps, hundreds of amps to thousands of amps;
(2) presetting an initial current $I_{nodes1}$, a termination current $I_{nodesn}$ and an amount n of current test points of the non-destructive dynamic impedance characteristic of the CFRP material, wherein n is not less than 5;
(3) outputting an initial test current by controlling the charging voltage of the lightning current component generating circuit, measuring the initial test current $I_{nodes1}$ which flows through a tested CFRP sample and a voltage $U_{nodes1}$ of the tested CFRP sample;
(4) outputting a second test current $I_{nodes2}$ by the single lightning current component generating circuit, measuring the test current $I_{nodes2}$ which flows through the tested CFRP sample and a voltage $U_{nodes2}$ of the tested CFRP sample;
(5) judging whether the test current $I_{nodes2}$ which flows through the tested CFRP sample reaches the termination current value; if the lightning current $I_{nodes2}$ which flows through the tested CFRP sample does not reach the termination current value, the single lightning current component generating circuit outputting a next test current till the test current reaches the termination current value, measuring a lightning current $I_{nodesn}$ which flows through the tested CFRP sample and a voltage $U_{nodesn}$ of the tested CFRP sample; and
(6) analyzing and processing the obtained multiple current and voltage data $(I_{nodes1}, U_{nodes1})$, $(I_{nodes2}, U_{nodes2})$, ..., $(I_{nodesn}, U_{nodesn})$ of the tested CFRP material, and obtaining a mathematical expression of the dynamic impedance of the CFRP material and waveform parameters of the non-destructive lightning current component.

Figure 3:
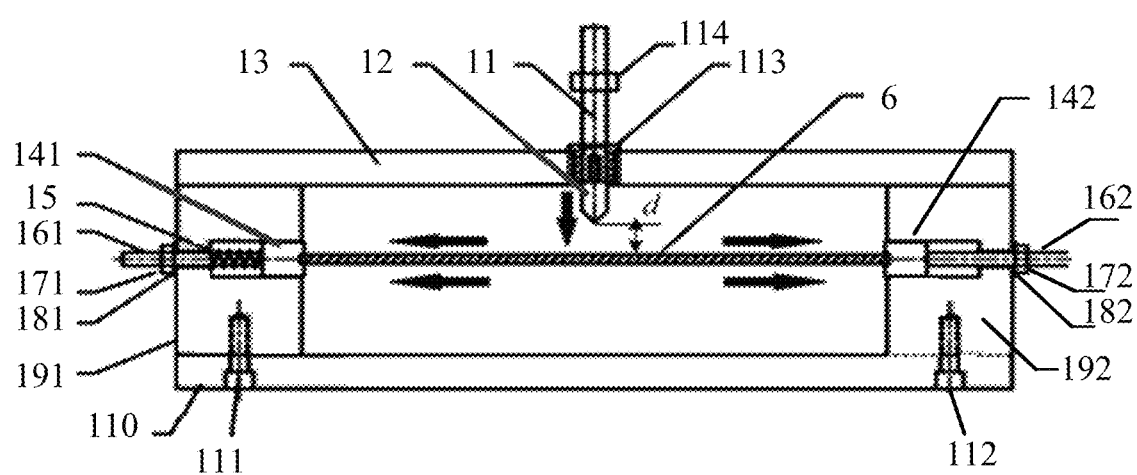
FIG. 3 is an installation diagram of the tested CFRP material in the destructive lightning test provided by the present invention.

FIG. 3 is an installation diagram of the tested CFRP material. As shown in FIG. 3, a high voltage terminal of lightning current component A generating circuit is electrically connected with an electrode bar 11 through a third nut 114; the electrode bar 11 is fixed with an insulated cover 13 through a fixed insulated sleeve 113; a test current is injected into a tested CFRP material through a tip 12 of electrode bar; the test current is drawn from the tested CFRP material through a first electrode block 141 and a second electrode block 142; a spring 15 clamps the tested CFRP material between the first electrode block 141 and the second electrode block 142; a low voltage terminal of the lightning current component A generating circuit is electrically connected with a first bolt 161 through a first nut 171 and a first gasket 181; an insulated base 110 of a fixture for installing the tested CFRP material is fixed with a first insulated support 191 and a second insulated support 192 through a third bolt 111 and a fourth bolt 112, respectively. The first copper block 141 and the second copper block 142 are clamped by the first nut 171 and the first gasket 181, and a second nut 172 and a second gasket 182 through the first bolt 161 and a right bolt 162, respectively.

Figure 4:
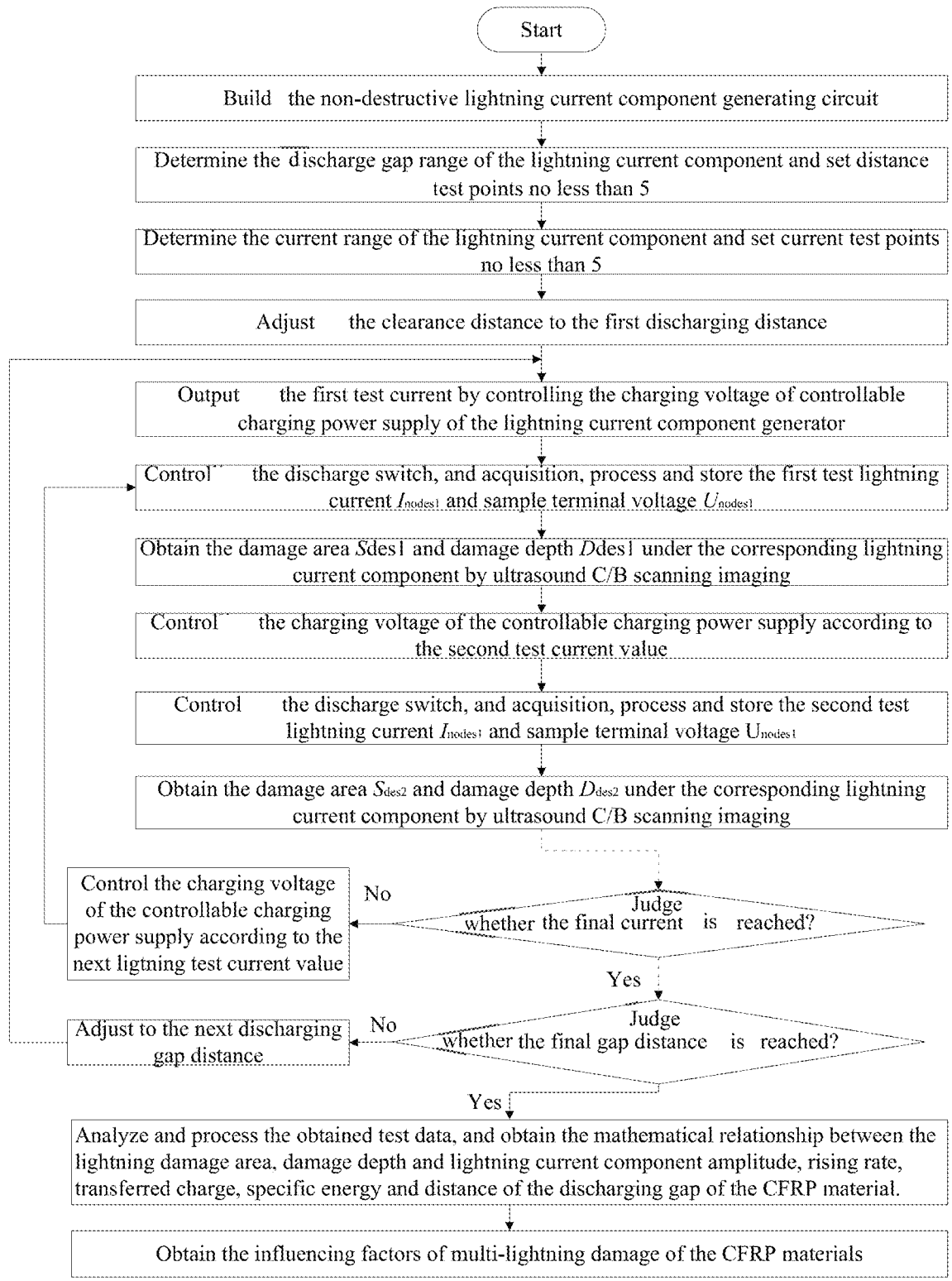
FIG. 4 is a test process for lightning damage assessment of the CFRP material under the action of the single destructive lightning current component provided by the present invention.

Referring to FIG. 4, a lightning damage test process of a CFRP material under an action of a destructive lightning current component comprises steps of:

(1) determining multiple discharge gaps for lightning damage test of the CFRP material in a range of 1-10 mm, wherein there are 3-5 discharge gaps are determined, such as 2 mm ($d_1$), 4 mm ($d_2$) ..., 10 mm ($d_m$);

(2) determining a current range of lightning current component and setting current test points no less than 5, wherein the test points are respectively 20 kA ($I_{des11}$), 40 kA ($I_{des12}$), ..., and 100 kA ($I_{des1n}$); or the test points are respectively 20 kA ($I_{des11}$), 50 kA ($I_{des12}$), ..., and 200 kA ($I_{des1n}$);

(3) outputting an initial test current $I_{des11}$ by a single lightning current component generating circuit, performing the lightning damage test on the tested CFRP material, measuring the test current $I_{des11}$ which flows through the tested CFRP material and a voltage $U_{des11}$ of the tested CFRP material, and obtaining a lightning damage area $S_{des11}$ and a lightning damage depth $D_{des11}$ through ultrasonic C/B scanning imaging;

(4) outputting a second test current $I_{des12}$ by the single lightning current component generating circuit, performing the lightning damage test on the tested CFRP material, measuring the test current $I_{des12}$ which flows through the tested CFRP material and a voltage $U_{des12}$ of the tested CFRP material, and obtaining a lightning damage area $S_{des12}$ and a lightning damage depth $D_{des12}$ through ultrasonic C/B scanning imaging;

(5) judging whether the test current $I_{des12}$ which flows through the tested CFRP material reaches a termination current value; if the lightning current $I_{des12}$ which flows through the tested CFRP material does not reach the termination current value, the single lightning current component generating circuit outputting a next test current till the test current reaches the termination current value, measuring a lightning current $I_{des1n}$ which flows through the tested CFRP material and a voltage $U_{des1n}$ of the tested CFRP material, and obtaining a lightning damage area $S_{des1n}$ and a lightning damage depth $D_{des1n}$ through ultrasonic C/B scanning imaging;

(6) selecting a next discharge gap for the lightning damage test of the tested CFRP material;

(7) repeating the steps (3) to (5), obtaining ($S_{des21}$, $D_{des21}$), ($S_{des22}$, $D_{des22}$), ..., ($S_{des2n}$, $D_{des2n}$) till obtaining ($S_{desm1}$, $D_{desm1}$), ($S_{desm2}$, $D_{desm2}$), ..., ($S_{desmn}$, $D_{desmn}$), wherein m is an amount of the selected discharge gap distances which is not less than 3; and (8) analyzing and processing the obtained multiple lightning damage areas and the obtained lightning damage depths ($S_{des11}$, $D_{des11}$), ($S_{des12}$, $D_{des12}$), ..., ($S_{des1n}$, $D_{des1n}$), ($S_{desm1}$, $D_{desm1}$), ($S_{desm2}$, $D_{desm2}$), ..., ($S_{desmn}$, $D_{desmn}$) of the tested CFRP material, obtaining the influencing of the amplitude, the rising rate, the charge transfer amount and the specific energy of the single lightning current component on the lightning damage area and damage depth of the CFRP material, building a lightning damage assessment model of CFRP material, and solving the coefficients corresponding to the multiple influencing factors of lightning damage of the tested CFRP material.

(1) The Relationship Between the Lightning Damage Area and Depth of the CFRP Material and the Parameters of the Lightning Current When the discharge gap is determined, the influencing factors of lightning damage of the CFRP material are the peak value, the rising rate, the charge transfer amount and the specific energy of the lightning current component. However, both the charge transfer amount and the specific energy are directly related to the peak current. Moreover, considering the non-linear impedance characteristic of the CFRP material under the action of the lightning current component, the specific energy is adjusted by the non-linear impedance of the CFRP material under the action of the specified lightning current component, relationships between the lightning damage area and depth and the parameters of the specified single lightning current component are expressed by formulas of:

$$S_{des} = k_{1s} \times \frac{di}{dt} + k_{2s} \int i dt + k_{3s} \times Z_R \times \int i^2 dt, \quad (1)$$

$$D_{des} = k_{1d} \times \frac{di}{dt} + k_{2d} \times \int i dt + k_{3d} \times Z_R \times \int i^2 dt, \quad (2)$$

wherein $k_{1s}$, $k_{2s}$ and $k_{3s}$ are respectively coefficients of the rising rate, the charge transfer amount and the specific energy of the specified single lightning current component to the lightning damage area of the CFRP material; $k_{1d}$, $k_{2d}$ and $k_{3d}$ are respectively coefficients of the rising rate, the charge transfer amount and the specific energy of the specified single lightning current component to the lightning damage depth of the CFRP material; $Z_R$ is a dynamic impedance corresponding to the peak value of the single specified lightning current component.

(2) Influencing Factors of the Lightning Damage Area and Depth of the CFRP Material From the above formulas (1) and (2), it can be seen that the two equations have 6 unknown variables. Therefore, test data of the lightning damage area and depth of at least 4 test points are required. If the stability of the influencing factors of the lightning damage of the CFRP material needs to be verified, the amount of the test points should be added, for example, no less than 5 test points are needed.

(3) If considering the effect of the discharge gap on the lightning damage of the CFRP material, in addition to the above formulas (1) and (2), the influencing factor of the discharge gap must be added, namely, then, there are 7 unknown variables in the above two formulas (1) and (2), by increasing the amount of test points and using the same calculation method, the coefficient corresponding to the influencing factor of the discharge gap is able to be calculated.

Finally, it should be noted that the above embodiment is only used to illustrate the technical solution of the present invention and is not the limitation to the present invention. Although the present invention has been described in detail with reference to the above embodiment, those skilled in the art should understand that: the specific embodiment of the present invention is still able to be modified or equivalently replaced, and any modification or equivalent replacement that does not deviate from the spirit and scope of the present invention shall be covered by the scope of the claims.

What is claimed is:

1. A lightning damage assessment method for a CFRP (carbon fiber reinforced polymer) material considering non-linear impedance characteristic, the method comprising steps of:
   (1) building a lightning current component test circuit, wherein the lightning current component test circuit comprises:
       a controllable DC (direct current) charging power supply comprising a voltage regulator, a transformer, a rectifier diode and a charging resistor, four of which are connected with each other in sequence;
       a lightning current discharge circuit comprising an energy storage capacitor, a discharge switch which is connected to one end of the energy storage capacitor, a waveform adjustment inductor and a waveform adjustment resistor, three of which are connected with each other in sequence; and
       the CFRP material, wherein one end of the CFRP material is connected with another end of the energy storage capacitor, and another end of the CFRP material is connected with the waveform adjustment resistor;
   (2) determining at least three discharge gap distances for lightning damage test of the CFRP material in a range of 1-10 mm, wherein m is an amount of the discharge gap distances;
   (3) determining a current range of a lightning current component and setting at least five current test points at a given discharge gap distance, such that at a first discharging gap distance, the current range is from $I_{des11}$ to $I_{des1n}$, where $I_{des11}$ is a lower limited current value, $I_{des1n}$ is an upper limited current value, n is an amount of the current test points;
   (4) selecting the first discharge gap distance for the lightning damage test of the CFRP material;
   (5) outputting a first test current by controlling a charging voltage of the controllable DC charging power supply, controlling the discharge switch, measuring a lightning current $I_{des11}$ which flows through the CFRP material and a voltage $U_{des11}$ of the CFRP material, and obtaining a lightning damage area $S_{des11}$ and a lightning damage depth $D_{des11}$ through ultrasonic C/B scanning imaging;
   (6) outputting a second test current by controlling the charging voltage of the controllable DC charging power supply, controlling the discharge switch, measuring a lightning current $I_{des12}$ which flows through the CFRP material and a voltage $U_{des12}$ of the CFRP material, and obtaining a lightning damage area $S_{des12}$ and a lightning damage depth $D_{des12}$ through ultrasonic C/B scanning imaging;
   (7) judging whether the lightning current $I_{des12}$ which flows through the CFRP material reaches the upper limited current value $I_{des1n}$; if the lightning current $I_{des12}$ does not reach the upper limited current value $I_{des1n}$, the lightning current discharge circuit continuously outputting a next test current till the lightning current reaches the upper limited current value $I_{des1n}$, measuring a voltage $U_{des1n}$ of the CFRP material, and obtaining a lightning damage area $S_{des1n}$ and a lightning damage depth $D_{des1n}$ through ultrasonic C/B scanning imaging;
   (8) selecting a next discharge gap distance for the lightning damage test of the CFRP material;
   (9) repeating the steps (5) to (7), obtaining ($S_{des21}$, $D_{des21}$), ($S_{des22}$, $D_{des22}$), ..., ($S_{des2n}$, $D_{des2n}$) till finally obtaining ($S_{desm1}$, $D_{desm1}$), ($S_{desm2}$, $D_{desm2}$), ..., ($S_{desmn}$, $D_{desmn}$); and
   (10) by analyzing and processing the obtained multiple lightning damage areas and the lightning damage depths ($S_{des11}$, $D_{des11}$), ($S_{des12}$, $D_{des12}$), ..., ($S_{des1n}$, $D_{des1n}$), ($S_{desm1}$, $D_{desm1}$), ($S_{desm2}$, $D_{desm2}$), ..., ($S_{desmn}$, $D_{desmn}$) of the CFRP material, obtaining relationships between lightning damage of the CFRP material, comprising the lightning damage area and depth, and multiple influencing factors, comprising an amplitude, a rising rate, a charge transfer amount and a specific energy of the lightning current component; building a lightning damage assessment model of the CFRP material; and solving coefficients corresponding to the multiple influencing factors of the lightning damage of the CFRP material.

2. The lightning damage assessment method according to claim 1, wherein in the step (10), the relationships between the lightning damage area and depth and the influencing factors of the lightning current component are expressed by formulas of:

$$S_{des} = k_{1s} \times \frac{di}{dt} + k_{2s} \int i dt + k_{3s} \times Z_R \times \int i^2 dt; \quad (1)$$

$$D_{des} = k_{1d} \times \frac{di}{dt} + k_{2d} \int i dt + k_{3d} \times Z_R \times \int i^2 dt, \quad (2)$$

here $k_{1s}$, $k_{2s}$ and $k_{3s}$ are respectively coefficients of the rising rate, the charge transfer amount and the specific energy of the lightning current component to the lightning damage area of the CFRP material; $k_{1d}$, $k_{2d}$ and $k_{3d}$ are respectively coefficients of the rising rate, the charge transfer amount and the specific energy of the lightning current component to the lightning damage depth of the CFRP material; $Z_R$ is a dynamic impedance of the CFRP material corresponding to a peak value of the lightning current component.

* * * * *